US008415706B2

(12) United States Patent
Umakoshi

(10) Patent No.: US 8,415,706 B2
(45) Date of Patent: Apr. 9, 2013

(54) OPTICAL SEMICONDUCTOR PACKAGE SEALING RESIN MATERIAL

(75) Inventor: Hideaki Umakoshi, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 0 days.

(21) Appl. No.: 12/734,927

(22) PCT Filed: Dec. 8, 2008

(86) PCT No.: PCT/JP2008/072274
§ 371 (c)(1),
(2), (4) Date: Jun. 3, 2010

(87) PCT Pub. No.: WO2009/078301
PCT Pub. Date: Jun. 25, 2009

(65) Prior Publication Data
US 2010/0270581 A1    Oct. 28, 2010

(30) Foreign Application Priority Data

Dec. 14, 2007  (JP) .................................. 2007-323529

(51) Int. Cl.
*H01L 33/52* (2010.01)
(52) U.S. Cl. .......... 257/100; 257/E33.059; 257/E31.117
(58) Field of Classification Search ................. 257/100, 257/433, E33.059, E31.117
See application file for complete search history.

(56) References Cited

U.S. PATENT DOCUMENTS

| 7,682,691 B2 * | 3/2010 | Akaho et al. .................. 428/339 |
| 2005/0107497 A1 | 5/2005 | Akaho et al. |
| 2005/0165151 A1 | 7/2005 | Fujiwara et al. |
| 2005/0280014 A1 * | 12/2005 | Park et al. ....................... 257/98 |

FOREIGN PATENT DOCUMENTS

| CN | 1643071 A1 | 7/2005 |
| JP | A-2003-012896 | 1/2003 |
| JP | A-2003-064243 | 3/2003 |
| JP | A-2004-176031 | 6/2004 |
| JP | A-2005-306952 | 11/2005 |

OTHER PUBLICATIONS

International Preliminary Report on Patentability in International Application No. PCT/JP2008/072274; dated Sep. 2, 2010.
International Search Report issued in International Application No. PCT/JP2008/072274; mailed on Jan. 13, 2009 (with English-language translation).
Chinese Office Action dated Oct. 10, 2011 issued in Chinese Patent Application No. 200880120872.4 (with translation).
Sep. 29, 2012 Office Action issued in Chinese Patent Application No. 200880120872.4; with English-language translation.

* cited by examiner

*Primary Examiner* — Zandra Smith
*Assistant Examiner* — Paul Patton
(74) *Attorney, Agent, or Firm* — Oliff & Berridge, PLC

(57) ABSTRACT

An optical semiconductor package sealing resin material used to seal an optical semiconductor chip in a semiconductor package includes a thermosetting epoxy composition and a hydrophobic smectite clay mineral. The hydrophobic smectite clay mineral is hydrophobized by subjecting a hydrophilic smectite clay mineral to an intercalation reaction with an alkylammonium halide. The smectite clay mineral is bentonite, saponite, hectorite, vermiculite, stevensite, tainiolite, montmorillonite, or nontronite.

10 Claims, 1 Drawing Sheet

OPTICAL SEMICONDUCTOR PACKAGE SEALING RESIN MATERIAL

TECHNICAL FIELD

The present invention relates to a colorless and transparent optical semiconductor package sealing resin material.

BACKGROUND TECHNOLOGY

Generally, optical semiconductor chips such as LEDs (light emitting diode devices), phototransistors, photodiodes, CCDs (charge-coupled devices), and EPROMs (erasable programmable ROMs) are sealed in packages in various forms. Representative examples of the sealing method used in the field of optical semiconductor chips include: (i) a method including mounting an optical semiconductor chip 2 on a ceramic container 1 and hermetically sealing the ceramic container 1 with a transparent glass cover 4 with an adhesive resin 3 therebetween (FIG. 1); (ii) a method including mounting an optical semiconductor chip 2 on a ceramic container 1, filling the ceramic container 1 with a transparent optical semiconductor package sealing resin material 5 composed mainly of a thermosetting epoxy composition, and curing the resin material 5 to hermetically seal the optical semiconductor chip 2 (FIG. 2); and (iii) a method including mounting an optical semiconductor chip 2 on a substrate 6 by wire bonding, potting the optical semiconductor chip 2 with a transparent optical semiconductor package sealing resin material 5, and curing the resin material 5 to hermetically seal the chip 2 (FIG. 3). In recent years, the methods in FIGS. 2 and 3 are mainly used instead of the method in FIG. 1.

The above optical semiconductor package sealing resin material is required to have high thixotropy so that it exhibits low viscosity when discharged from a dispenser during sealing operation, in particular during potting operation, and exhibits high viscosity, i.e., low flowability, after potting. The cured product of the optical semiconductor package sealing resin material is required to have transparency (particularly colorless transparency) that does not vary with time. The difference in linear expansion coefficient between the cured product and a substrate on which an optical semiconductor chip to be sealed is mounted can cause warpage and cracks in the cured product. Therefore, the cured product is required to have properties that can prevent warpage and cracks from occurring, i.e., to have good crack resistance. In addition, an urgent issue is to suppress discoloration of the cured sealing resin material by ultraviolet rays and to suppress deterioration of its mechanical properties.

To solve the above problems, Patent Document 1 proposes that a specific aromatic compound such as a phenol benzoate is added to a curable epoxy composition which constitutes an optical semiconductor package sealing resin material.

[Patent Document 1] Japanese Patent Application Laid-Open No. 2003-64243

DISCLOSURE OF THE INVENTION

Problems to be Solved by the Invention

In Patent Document 1, the improvement in thixotropy of the curable epoxy composition and the improvement in crack resistance of the cured product are not mentioned. Therefore, to improve the thixotropy and the crack resistance, a fine inorganic filler such as silica may be added to the curable epoxy composition, as described in an embodiment in Patent Document 1. The addition of such an inorganic filler may increase the thixotropy ratio of the composition and reduce the linear expansion coefficient to reduce the difference in linear expansion coefficient between the composition and a substrate, so that the crack resistance may be improved.

However, when a fine inorganic filler such as silica fine particles is added to the curable epoxy composition, part of the particles are aggregated to form secondary particles having relatively large diameters, and light is reflected from the surfaces of the secondary particles. This causes a problem in that the haze factor of the cured product increases and the transparency is thereby reduced. At present, none of the conventional optical semiconductor package sealing resin materials composed mainly of curable epoxy compositions can meet all the requirements including colorless transparency, high thixotropy, and good crack resistance.

It is an object of the present invention to solve the conventional problems described above and more specifically to impart good transparency, high thixotropy, and also good crack resistance to an optical semiconductor package sealing resin material composed mainly of a curable epoxy composition.

Means for Solving the Problems

The present inventor has found that the above object can be achieved by using, as a filler, a hydrophobic smectite clay mineral instead of conventional silica particles. Thus, the present invention has been completed.

Accordingly, the present invention provides an optical semiconductor package sealing resin material used to seal an optical semiconductor chip in a semiconductor package, the optical semiconductor package sealing resin material comprising a thermosetting epoxy composition and a hydrophobic smectite clay mineral.

The present invention also provides an optical semiconductor device including an optical semiconductor chip that is sealed with the above optical semiconductor package sealing resin material to thereby form a semiconductor package.

Effects of the Invention

In the optical semiconductor package sealing resin material of the present invention, a hydrophobic smectite clay mineral is used as a filler. Therefore, a dispersion obtained by mixing and dispersing the hydrophobic smectite clay mineral and the epoxy composition has good transparency and high thixotropy, and the cured product thereof exhibits good crack resistance. These high thixotropy and good crack resistance are at least equivalent to the effects obtained when silica particles are used. In contrast to the case in which the silica particles are used, the transparency of the cured product is not reduced even when the hydrophobic smectite clay mineral is used. This may be because of the following reasons.

The hydrophobic smectite clay mineral is a layered compound. When the hydrophobic smectite clay mineral is dispersed in the epoxy composition, the epoxy compound is introduced between the layers of the clay mineral, and it swells to form an "epoxy-clay mineral dispersion" in a sol form. Therefore, the hydrophobic smectite clay mineral may not be present as single-component particles in the dispersion, and light entering the dispersion passes therethrough without being reflected from the "epoxy-clay mineral dispersion." When the optical semiconductor package sealing resin material containing the "epoxy-clay mineral dispersion" in the above state is cured, the cured product also has colorless transparency.

DESCRIPTION OF THE REFERENCE NUMERALS

Figure 1:
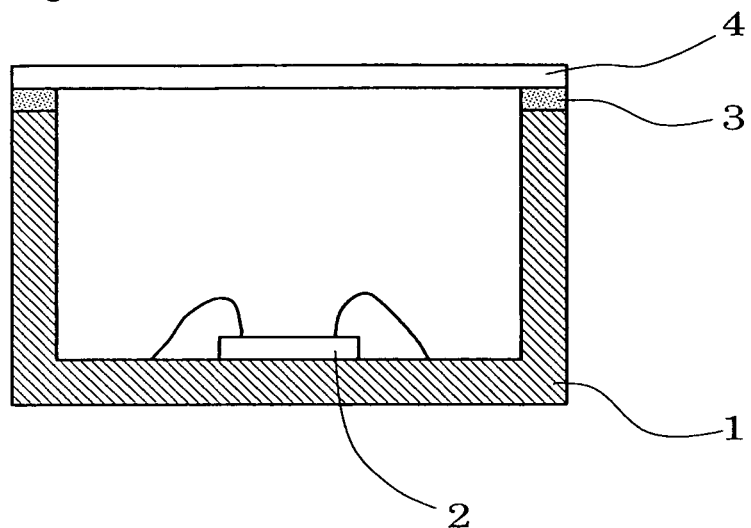
FIG. 1 is a cross-sectional view of a typical sealed package used in the field of optical semiconductor chips.

1 ceramic container
2 optical semiconductor chip
3 adhesive resin
4 transparent glass cover
5 optical semiconductor package sealing resin material
6 substrate

BEST MODE FOR CARRYING OUT THE INVENTION

An optical semiconductor package sealing resin material of the present invention is used to seal an optical semiconductor chip to form a semiconductor package and comprises a thermosetting epoxy composition and a hydrophobic smectite clay mineral. Examples of the optical semiconductor chip include semiconductor chips having a function of emitting or receiving light. Specific examples thereof include LEDs (light emitting diode devices), phototransistors, photodiodes, CCDs (charge-coupled devices), and EPROMs (erasable programmable ROMs). The package used may be similar to a conventional optical semiconductor package.

The smectite clay mineral has a layered structure having swelling properties and more specifically is an inorganic compound having a structure including three stacked layers (silica tetrahedron-alumina octahedron-silica tetrahedron layers). Such a clay mineral has a negative charge, and holds cations such as sodium ions and calcium ions or water molecules present between the layers to ensure charge neutrality. The smectite clay mineral in this state is hydrophilic.

Examples of the smectite clay mineral include minerals referred to as bentonite, saponite, hectorite, vermiculite, stevensite, tainiolite, montmorillonite, and nontronite. These minerals are distinguished by the atoms in their tetrahedral-octahedral cation sites. Any of the natural products and also artificial products of these minerals may be used. Of these, hectorite, which absorbs little light in the visible range and can give a colorless transparent cured product, can be preferably used.

Since the interlayer ionic bonding force of the hydrophilic smectite clay mineral is low, the hydrophilic smectite clay mineral can contain a large amount of water molecules introduced between the layers thereof and thereby swells. A dispersion of the swelled hydrophilic smectite clay mineral in water forms a sol and allows light to transmit therethrough. Since the bonding force of the interlayer ionic bonds is weak, cations such as sodium ions can be exchanged with ionic organic compounds (for example, alkylammonium halides such as tetradodecylammonium bromide, tetraoctadecylammonium bromide, and dimethyloctadecylammonium chloride, alkyl amines such as dimethyltetradecylamine; and the like) (intercalation). When an ionic organic material is intercalated between the layers, the degree of polarity of the surface of the smectite clay mineral is reduced (or the surface is not polarized), and the smectite clay mineral becomes hydrophobic. The hydrophobized smectite clay mineral can be dispersed and can swell in various organic solvents.

The alkyl ammonium ions and alkyl amine ions in the hydrophobic smectite clay mineral function as a curing accelerator for accelerating the curing of the curable epoxy composition. Therefore, when the amount of the hydrophobic smectite clay mineral in the optical semiconductor package sealing resin material is too small, the catalytic function of hydrophobic smectite clay mineral is not achieved, so that the curing does not proceed (the resin material is not cured). When the amount is too large, the transmittance of the cured product is low. Therefore, the amount of the hydrophobic smectite clay mineral is preferably 1 to 10 mass %, more preferably 2 to 7 mass %, and particularly preferably 2.5 to 5.5 mass %.

The thermosetting epoxy composition included in the optical semiconductor package sealing resin material of the present invention contains an epoxy compound such as an epoxy monomer, an epoxy oligomer, or an epoxy prepolymer and a curing agent for curing the epoxy compound.

In the present invention, an epoxy compound having no double bond in its molecule is preferably used in order to ensure transparency (in particular colorless transparency), and an alicyclic epoxy compound and/or a hydrogenated aromatic epoxy compound is particularly preferably used. Examples of the alicyclic epoxy compound include 3,4-epoxycyclohexenylmethyl-3',4'-epoxycyclohexene carboxylate and 1,2-epoxy-4-2(oxiranyl)cyclohexane adduct of 2,2-bis(hydroxymethyl)-1-butanol. Examples of the hydrogenated aromatic epoxy compound include hydrogenated bisphenol-A epoxy compounds and hydrogenated bisphenol-F epoxy compounds. Of these, 3,4-epoxycyclohexenylmethyl-3',4'-epoxycyclohexene carboxylate and hydrogenated bisphenol-A epoxy compounds are preferably used because of their heat resistant light-transmittance.

When the total amount of the alicyclic epoxy compound and the hydrogenated aromatic epoxy compound based on the total amount of the resin components in the thermosetting epoxy composition (the total amount of resin components and components that form resins after curing) is too small, the transmittance of the cured product is low. When the total amount is too large, the crack resistance is low. Therefore, the total amount is preferably 50 to 95 mass %, more preferably 70 to 95 mass %, and particularly preferably 75 to 95 mass %.

Preferably, to ensure the transparency of the cured product, the curing agent has no double bond in its molecule. An alicyclic or aliphatic acid anhydride is particularly preferred as the curing agent. Examples of the alicyclic acid anhydride include hexahydrophthalic acid anhydride and methyl-hexahydrophthalic acid anhydride. Examples of the aliphatic acid anhydride include dodecenyl succinic acid anhydride. Of these, methyl-hexahydrophthalic acid anhydride can be preferably used in terms of heat resistant light transmittance.

The amount of the acid anhydride curing agent added in the thermosetting epoxy composition is determined in conjunction with the amount of the epoxy compound. More specifically, when the ratio of the epoxy equivalent of the epoxy compound contained in the thermosetting epoxy composition to the acid anhydride equivalent of the acid anhydride curing agent is too small, the hygroscopicity is low. When the ratio is too high, the heat resistant light transmittance and hygroscopicity are low. Therefore, the acid anhydride curing agent is added so that the above ratio is preferably 0.85 to 1.15 and more preferably 0.9 to 1.05. When a plurality of acid anhydride curing agents and a plurality of epoxy compounds are used, it is preferable that the ratio of the total epoxy equivalent to the total acid anhydride equivalent be equal to the ratio of the epoxy equivalent of any of the epoxy components to the acid anhydride equivalent of any of the acid anhydride curing agents.

To improve the adhesion force and elasticity of the semiconductor package sealing resin material, a urethane resin or an acrylic resin may be added to the thermosetting epoxy composition. A urethane resin is produced by the reaction of a polyol with polyisocyanate. Examples of the polyol include polycarbonate diols and polyhydroxyalkanoates. Examples of the acrylic resin include homopolymers and copolymers of ethyl acrylate, butyl acrylate, butyl methacrylate, glycidyl methacrylate, and 2-ethylhexyl acrylate. These are preferred because of their high transparency and good weather resistance.

When the amount of such a urethane resin added to the thermosetting epoxy composition is too small, the effect of addition is not obtained. When the amount is too large, the heat resistant light transmittance is low. Therefore, the amount based on the total amount of the resin components in the thermosetting epoxy composition (the total amount of resin components and components that form resins after curing) is preferably 1 to 10 mass % and more preferably 5 to 10 mass %. When the amount of the acrylic resin added to the thermosetting epoxy composition is too small, the effect of addition is not obtained. When the amount is too large, the heat resistant light transmittance is low. Therefore, the amount is preferably 5 to 20 mass % and more preferably 10 to 15 mass %. In the case where both the urethane resin and the acrylic resin are used, the effect of addition is not obtained when the amount used is too small. When the amount used is too large, the heat resistant light transmittance is low. Therefore, the amount used is preferably 1 to 20 mass % and more preferably 5 to 10 mass %.

The thermosetting epoxy composition may further contain a known curing accelerator such as a quaternary ammonium salt, p-toluenesulfonic acid salt of 1,8-diazabicyclo[5.4.0] undec-7-ene (DBU), or an organic phosphine. Moreover, the thermosetting epoxy composition may further contain a primary antioxidant such as a radical chain inhibitor that captures radicals (ROO.) generated during the deterioration process of the cured product. Examples thereof include a phenol-based antioxidant or amine-based antioxidant may be added. In addition, the thermosetting epoxy composition may further contain a secondary antioxidant such as a peroxide decomposer that captures unstable peroxides (ROOH) and actively decomposes them to form stable compounds. Examples thereof include an ion-based antioxidant or phosphorus-based antioxidant may be added.

The thermosetting epoxy composition may further contain a known UV absorber, coupling agent, fire retardant, and other additives according to the application of the cured product.

The optical semiconductor package sealing resin material of the present invention can be manufactured by uniformly mixing the thermosetting epoxy composition containing the above components and the hydrophobic smectite clay mineral using routine methods. In the obtained optical semiconductor package sealing resin material, the hydrophobic smectite clay mineral contains the epoxy compound introduced between the layers thereof and swells to form an "epoxy-clay mineral dispersion" in a sol form. In particular, when colorless transparency is required, it is preferable that the band gap of the clay mineral in the "epoxy-clay mineral dispersion" be greater than visible light absorption energy. More specifically, the band gap is preferably 3.3 eV or more.

When the concentration of the clay mineral in the "epoxy-clay mineral dispersion" is too low, the crack resistance (flexibility) is not obtained. When the concentration is too high, the clay mineral is precipitated to cause whitish or yellowish color. Therefore, the concentration is preferably 1 to 10 mass % and more preferably 2 to 7 mass %.

Figure 2:
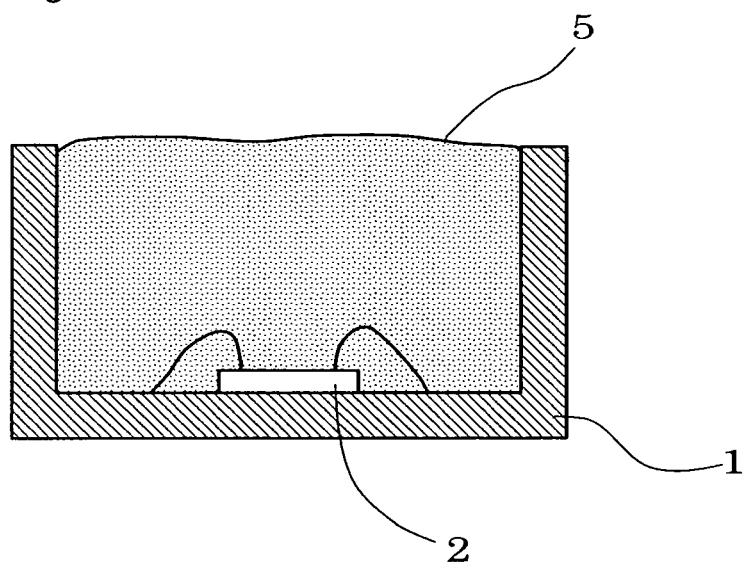
FIG. 2 is a cross-sectional view of another sealed package used in the field of optical semiconductor chips.
Figure 3:
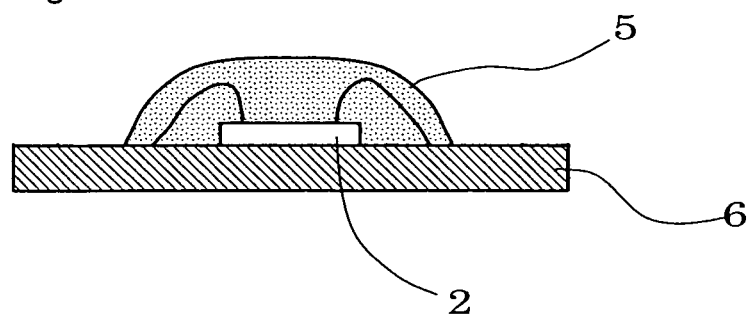
FIG. 3 is a cross-sectional view of another sealed package used in the field of optical semiconductor chips.

The optical semiconductor package sealing resin material of the present invention is preferably applied to optical semiconductor devices. Such optical semiconductor devices are also part of the present invention. More specifically, in such optical semiconductor devices, an optical semiconductor chip is sealed with the optical semiconductor package sealing resin material to form a semiconductor package and can have the structures shown in FIGS. 2 and 3, for example. The optical semiconductor devices can have a structure similar to those of conventional optical semiconductor devices except that the optical semiconductor package sealing resin material of the present invention is used as the sealing resin.

EXAMPLES

Hereinafter, the present invention will be described in more detail by way of Examples.

Reference Example 1

Preparation of Epoxy-Clay Mineral Dispersion Using Hydrophobic Hectorite 5 g of hectorite being synthetic smectite (Lucentite SEN, CO-OP CHEMICAL CO., LTD.) was added to 100 g of toluene, and the mixture was stirred at room temperature for 6 hours to disperse the hectorite therein, whereby a viscous clay mineral dispersion was obtained. The chemical formula of the hectorite is represented by $Na_{0.33}(Mg_{2.67}Li_{0.33})Si_4O_{10}(OH)_2$, and polyoxyethylene and alkyl methyl ammonium ions are intercalated between the layers of the hydrophobic hectorite used.

The obtained clay mineral dispersion was added to an epoxy dispersion prepared in advance by dispersing 45 g of a liquid hydrogenated bisphenol-A epoxy compound (YX8000, Japan Epoxy Resin Co., Ltd.) in 100 g of dimethylformamide, and the mixture was stirred at room temperature for 24 hours to give a colorless transparent epoxy dispersion.

The obtained epoxy dispersion was concentrated under reduced pressure in an evaporator to give an "epoxy-clay mineral dispersion." The concentration of the clay mineral in the dispersion was 10 mass %.

Reference Example 2

Preparation of Epoxy-Clay Mineral Dispersion Using Hydrophobic Bentonite 5 g of bentonite being synthetic smectite (S-BEN NX, HOJUN Co., Ltd.) was added to 100 g of toluene, and the mixture was stirred at room temperature for 6 hours to disperse the bentonite therein, whereby a viscous clay mineral dispersion was obtained. The chemical formula of the bentonite is generally represented by $Na_{0\ to\ 0.66}Ca_{0\ to\ 0.66}(Mg_{0\ to\ 0.66}Al_{3.34})Si_8O_{20}(OH)_4$ which varies depending on the synthetic conditions, and trioctylammonium ions are intercalated between the layers of the hydrophobic bentonite used.

The obtained clay mineral dispersion was added to an epoxy dispersion prepared in advance by dispersing 45 g of a liquid hydrogenated bisphenol-A epoxy compound (YX8000, Japan Epoxy Resin Co., Ltd.) in 100 g of toluene, and the mixture was stirred at room temperature for 24 hours to give a colorless transparent epoxy dispersion.

The obtained epoxy dispersion was concentrated under reduced pressure in an evaporator to give an "epoxy-clay mineral dispersion." The concentration of the clay mineral in the dispersion was 10 mass %.

Reference Example 3

Preparation of Epoxy-Clay Mineral Dispersion Using Hydrophilic Hectorite 1 g of hectorite being synthetic smectite (Lucentite SEN, CO-OP CHEMICAL CO., LTD.) was added to 99 g of ultrapure water, and the mixture was stirred at room temperature for 6 hours to disperse the hectorite therein, whereby a viscous clay mineral dispersion was obtained. The chemical formula of the hectorite is represented by $Na_{0.33}(Mg_{2.67}Li_{0.33})Si_4O_{10}(OH)_2$, and Na ions and water molecules are intercalated between the layers of the hydrophilic hectorite used.

An ethanol dispersion of 1 g of tetradecyl ammonium bromide in 7 g of ethanol was added dropwise to the obtained clay mineral dispersion at room temperature and a rate of 0.5 mL/sec under stirring. The mixture was further stirred at room temperature for 6 hours. Then the resultant mixture was filtrated through a 65 μm-mesh filter under reduced pressure, and the hydrophobic clay mineral remaining on the filter was dried at 100° C. for 1 hour. The obtained dried product was pulverized to give a powdery hydrophobic smectite clay mineral.

5 g of the obtained hydrophobic smectite clay mineral was added to 100 g of methyl ethyl ketone, and the mixture was stirred at room temperature for 6 hours to disperse the clay mineral therein, whereby a viscous clay mineral dispersion was obtained.

The obtained clay mineral dispersion was added to an epoxy dispersion prepared in advance by dispersing 45 g of a liquid hydrogenated bisphenol-A epoxy compound (YX8000, Japan Epoxy Resin Co., Ltd.) in 100 g of methyl ethyl ketone, and the mixture was stirred at room temperature for 24 hours to give a colorless transparent epoxy dispersion.

The obtained epoxy dispersion was concentrated under reduced pressure in an evaporator to give an "epoxy-clay mineral dispersion." The concentration of the clay mineral in the dispersion was 10 mass %.

Reference Example 4

Preparation of Epoxy-Clay Mineral Dispersion Using Hydrophilic Montmorillonite 1 g of montmorillonite being synthetic smectite (Kunipia F, KUNIMINE INDUSTRIES CO., LTD.) was added to 99 g of ultrapure water, and the mixture was stirred at room temperature for 6 hours to disperse the montmorillonite therein, whereby a viscous clay mineral dispersion was obtained. The chemical formula of the montmorillonite is represented by $Na_{0.66}(Mg_{0.66}Al_{3.34})Si_8O_{20}(OH)_4$, and Na ions and water molecules are intercalated between the layers of the hydrophilic montmorillonite.

An ethanol dispersion of 1 g of tetradecyl ammonium bromide in 7 g of ethanol was added dropwise to the obtained clay mineral dispersion at room temperature and a rate of 0.5 mL/sec under stirring. The mixture was further stirred at room temperature for 6 hours. Then the resultant mixture was filtrated through a 65 μm-mesh filter under reduced pressure, and the hydrophobic clay mineral remaining on the filter was dried at 100° C. for 1 hour. The obtained dried product was pulverized to give a powdery hydrophobic smectite clay mineral.

5 g of the obtained hydrophobic smectite clay mineral was added to 100 g of methyl ethyl ketone, and the mixture was stirred at room temperature for 6 hours to disperse the clay mineral therein, whereby a viscous clay mineral dispersion was obtained.

The obtained clay mineral dispersion was added to an epoxy dispersion prepared in advance by dispersing 45 g of a liquid hydrogenated bisphenol-A epoxy compound (YX8000, Japan Epoxy Resin Co., Ltd.) in 100 g of methyl ethyl ketone, and the mixture was stirred at room temperature for 24 hours to give a colorless transparent epoxy dispersion.

The obtained epoxy dispersion was concentrated under reduced pressure in an evaporator to give an "epoxy-clay mineral dispersion." The concentration of the clay mineral in the dispersion was 10 mass %.

Examples 1 to 5 and Comparative Examples 1 and 2

Components shown in Table 1 were uniformly mixed at the compositions shown therein, and the mixtures were heated at 150° C. for 2 hours, whereby optical semiconductor package sealing resin materials forming transparent cured products were obtained. Each of the obtained sealing resin materials was subjected to the following evaluation tests (a) to (i). The results obtained are shown in Table 1.

((a) Test for Evaluating Resin Properties)

To evaluate the thixotropy of each sealing resin material, the viscosity of the sealing resin material was measured using a rheometer (RheoStress RS-150, HAAKE) (measurement conditions: 25° C., parallel plate used, gap: 0.052 mm, frequency: 0.6 to 600 $s^{-1}$). A thixotropy index value (TI value) was determined by dividing the viscosity measured at 10 $s^{-1}$ by the viscosity measured at 1

((b) Test for Evaluating Curing Properties)

The gel time and tack-free time of each sealing resin material were evaluated. The gel time was measured as follows. A 1 mm-thick glass substrate was placed on a hot plate heated at 150° C. The sealing resin material was dripped on the glass substrate, and the time (gel time) when the gelation (curing) of the sealing resin material started was measured. Then the sealing resin material was cured, and the time (tack-free time) when the material did not adhere to a finger placed on its surface and was not sticky was measured.

((c) Test for Evaluating Physical Properties: Glass Transition Temperature and Linear Expansion Coefficients)

The glass transition temperature and linear expansion coefficients of a cured product were measured using a thermomechanical analyzer (TMA/SS6000, Seiko Instruments Inc.). More specifically, a bulk of the cured product of each sealing resin material (a cylindrical body, diameter: 5 mm, height: 15 mm) was produced, and the measurement was performed by compressing the bulk at 4.9 mN. The temperature rising rate was set to 10° C./minute.

((d) Test for Evaluating Physical Properties: Warpage of Substrate)

A silicone frame (1 mm thick and 5 mm width) was applied to the circumferential edge portion of a 0.2 mm thick glass epoxy substrate (60 mm square), and a sealing resin material was dripped inside the frame so that the thickness thereof was 1 mm. Then the sealing resin material was cured. The separation heights from the substrate were measured at the four corners to evaluate the warpage of the substrate.

((e) Test for Evaluating Physical Properties: Crack Resistance)

The samples produced for evaluating the warpage of the substrates were left to stand in a moisture-absorbing environment (JEDEC level 3) at 30° C./60% RH for 192 hours. Then each sample was immersed in a reflow bath (max 260° C.) for 10 seconds and placed in a cold-heat cycle test bath at −40° C. and 125° C. (one cycle: total of 1 hour, −40° C. for 30 minutes and 125° C. for 30 minutes). The occurrence of cracks in the cured product was visually observed after immersion in the reflow bath and after the cold-heat cycle test (1000 cycles).

((f) Test for Evaluating Physical Properties: Initial Light-Transmittance at 450 nm)

Each sealing resin material was cured into a plate (10 mm square and 1 mm thick), and the cured product was measured for the initial light-transmittance at 450 nm using a spectrophotometer (U-3300, Spectro Photometer, Hitachi High-Technologies Corporation).

((g) Test for Evaluating Physical Properties: Haze)

The turbidity of each plate-like cured product used in the initial light-transmittance evaluation test was measured using a haze meter (Σ80 Color Measuring System, Nippon Denshoku Industries Co., Ltd.). More specifically, the turbidity was computed by dividing the value of the scattering light transmittance obtained by the measurement by the total light-transmittance.

((h) Test for Evaluating Physical Properties: Heat and Moisture Resistant Light-Transmittance)

The cured product just after curing of each sealing resin material was measured for the initial light-transmittance at 450 nm using a spectrophotometer (U-3300, Spectro Photometer, Hitachi High-Technologies Corporation). Then the cured product was placed in a reflow bath, and heat treatment (a temperature profile with a maximum of 260° C.) was repeated three times (10 seconds each). Then the sample was placed in an oven at 130° C. or an oven at 85° C./85% RH. The sample was removed after 1000 hours, and the transmittance was again measured.

((i) Test for Evaluating Physical Properties: Heat and Light Resistant Light-Transmittance)

The cured product just after curing of each sealing resin material was measured for the initial transmittance of light at 450 nm using a spectrophotometer (U-3300, Spectro Photometer, Hitachi High-Technologies Corporation). Then, the cured product was placed in a reflow bath, and heat treatment (a temperature profile with a maximum of 260° C.) was repeated three times (10 seconds each). Then the sample was subjected to UV fading test (30 W/m$^2$, peak wavelength light source: 380 nm, 60° C.) for 100 hours using a fade meter (Suga Test Instruments Co., Ltd.), and the light-transmittance was again measured.

TABLE 1

|  |  |  | Ex. 1 | Ex. 2 | Ex. 3 | Ex. 4 | Ex. 5 | Comp. Ex. 1 | Comp. Ex. 2 |
|---|---|---|---|---|---|---|---|---|---|
| Materials | Epoxy resin | Hydrogenated bisphenol-A epoxy (YX8000, Japan Epoxy Resin Co., Ltd.) | — | — | — | — | — | 45 | 45 |
|  | Curing agent | Methyl-hexahydrophthalic acid anhydride (HN5500, Hitachi Chemical Co., Ltd.) | 55 | 55 | 55 | 55 | 55 | 55 | 55 |
|  | Curing accelerator | DBU-p-toluenesulfonic acid salt (U-CAT SA506, San-Apro Ltd.) | 1 | 1 | 1 | 1 | — | 1 | 1 |
|  | Antioxidant | Phenol-based antioxidant (ADK STAB AO-50, ADEKA Corporation) | 0.5 | 0.5 | 0.5 | 0.5 | 0.5 | 0.5 | 0.5 |
|  |  | Phosphorous-based antioxidant (ADK STAB PEP-8, ADEKA Corporation) | 0.5 | 0.5 | 0.5 | 0.5 | 0.5 | 0.5 | 0.5 |
|  | Epoxy-clay mineral dispersion | YX8000 + clay mineral Note: clay used | 45 + 5 Ref. Ex. 1 | 45 + 5 Ref. Ex. 2 | 45 + 5 Ref. Ex. 3 | 45 + 5 Ref. Ex. 4 | 45 + 5 Ref. Ex. 1 | — | — |
|  | Filler | Silicon oxide (R202, Nippon Aerosil Co., Ltd.) | — | — | — | — | — | — | 5 |
| Properties of rein | (a) Viscosity | Viscosity (Pa · s) @1 s$^{-1}$ | 67.3 | 69.9 | 80.2 | 77.8 | 65.4 | 1.2 | 72.6 |
|  |  | Viscosity (Pa · s) @10 s$^{-1}$ | 15.1 | 15.8 | 14.5 | 15.0 | 14.6 | 1.2 | 11.6 |
|  |  | TI value (thixotropy ratio) | 4.5 | 4.4 | 5.5 | 5.2 | 4.5 | 1.0 | 6.3 |
| Curing properties | (b) Gel Time | (min) @150° C. | 2 | 2 | 2 | 2 | 120 | 2 | 2 |
|  | (b) Tack-free time | (min) @150° C. | 10 | 10 | 10 | 10 | 240 | 10 | 10 |
| Physical properties | (c) Mechanical properties | Glass transition temperature (° C.) | 163 | 160 | 160 | 160 | 164 | 160 | 160 |
|  |  | Linear expansion coefficient α1 (ppm) | 67 | 65 | 74 | 70 | 70 | 82 | 65 |
|  |  | Linear expansion coefficient α2 (ppm) | 170 | 170 | 170 | 170 | 170 | 190 | 170 |
|  | (d) Substrate warpage | Total separation height (mm) | 20 | 20 | 20 | 20 | 20 | 28 | 19 |
|  | (e) Crack resistance, after moisture-absorption and reflow | N = 5 | No | No | No | No | No | Yes | No |
|  | (e) Crack resistance, after cold-heat cycle test | N = 5 | No | No | No | No | No | No | No |
|  | (f) Initial light-transmittance | % | 92 | 89 | 92 | 89 | 92 | 92 | 90 |
|  | (g) Haze (initial) | % | 0.3 | 0.3 | 0.4 | 0.4 | 0.3 | 0.0 | 24.0 |
|  | (h) Heat and moisture resistant light-transmittance 130° C., 1000 hrs. | % | 88 | 80 | 86 | 77 | 88 | 89 | 82 |

TABLE 1-continued

|  |  | Ex. 1 | Ex. 2 | Ex. 3 | Ex. 4 | Ex. 5 | Comp. Ex. 1 | Comp. Ex. 2 |
|---|---|---|---|---|---|---|---|---|
| (h) Heat and moisture resistant light-transmittance 85° C./85% RH, 1000 hrs. | % | 91 | 79 | 90 | 79 | 91 | 90 | 93 |
| (i) Heat and light resistant light-transmittance, thermal UV, 100 hours | % | 86 | 70 | 83 | 70 | 85 | 86 | 79 |

In Comparative Example 1 in which no epoxy-clay mineral dispersion was used, the sealing resin material did not exhibit thixotropy. However, in Examples 1 to 5 in which epoxy-clay mineral dispersions were used, the TI values were large, and the sealing resin materials exhibited good thixotropy. The results show that these sealing resin materials have good adhesion to the substrates and can be used as printing resins.

The gel time and tack-free time were controlled by adjusting the used amount of the curing accelerator such that the standard curing time and curing temperature for epoxy resins in this field were obtained. In Comparative Examples 1 and 2 and Examples 1 to 4, the gel time was 2 minutes, and the tack-free time was 10 minutes. In Example 5, the curing accelerator was not used on purpose. Therefore, although the gel time and tack-free time were long, the resin was completely cured because the alkyl ammonium in the clay mineral served as a catalyst.

Almost no difference in glass transition temperature was found among the Examples and Comparative Example. This shows that the addition of the clay mineral does not have influence on the glass transition temperature. However, the linear expansion coefficients $\alpha 1$ and $\alpha 2$ in Examples 1 to 5 and in Comparative Example 2 in which silica filler powder was added were less than those in Comparative Example 1 by 8 ppm or more. This shows that the epoxy-clay mineral dispersion contributes to the suppression of the thermal expansion of the sealing resin materials.

In the "substrate warpage evaluation" of the glass epoxy substrates having the cured sealing resin materials applied thereto, the values in Examples 1 to 5 were lower than the value in Comparative Example 1, and the "improvement in substrate warpage" was achieved. Therefore, the epoxy-clay mineral dispersions may contribute to the reduction in the linear expansion coefficients (the glass transition temperature of the glass epoxy substrate is 125° C., and the $\alpha 1$ and $\alpha 2$ thereof are 60 ppm and 260 ppm, respectively).

The initial haze in Examples 1 to 5 showed that the transparency was high. However, the haze value in Comparative Example 2 in which silica fine particles were used was high because light was scattered on the surfaces of the particles.

When the cured product was subjected to water-absorbing reflow treatment, cracks were formed in the samples of Comparative Example 1 (all the 5 samples). However, in Examples 1 to 5, no cracks were formed. This shows that the epoxy-clay mineral dispersions have an effect of reducing linear expansion coefficients. The samples used for the evaluation after the water-absorbing reflow were then subjected to TCT test for 1000 hours. No cracks were found in all the seven types of samples. This may be because Tg was much higher than the range of the temperature cycle. Since cracks were formed in the samples of Comparative Example 1 in the preceding test and could not be used for this evaluation, other samples produced for the substrate warpage evaluation test were subjected only to water absorbing treatment and used for the TCT test.

As can be seen from the results of the initial light-transmittance evaluation, the light-transmittances in Example 1 to 5 are substantially the same as the light transmittance in Comparative Example 1. This shows that the addition of the epoxy-clay mineral dispersions does not cause a reduction in light-transmittance.

In Examples 2 and 4, the bentonite.montmorillonite in the epoxy absorbed light with blue wavelengths, and this caused slightly "yellow" color. However, high transmittance was maintained. In Examples 2 and 4, since the resin is colored, the light transmittance tends to be reduced by the influence of heat and light.

INDUSTRIAL APPLICABILITY

With the optical semiconductor chip sealing resin material of the present invention, good transparency, high thixotropy, and also good crack resistance can be imparted to the optical semiconductor package sealing resin material composed mainly of a curable epoxy composition. Therefore, the optical semiconductor chip sealing resin material of the present invention is useful as the material for sealing optical semiconductor chips such as LEDs (light-emitting diode devices), phototransistors, photodiodes, CCDs (charge-coupled devices), and EPROMs (erasable programmable ROMs).

The invention claimed is:

1. An optical semiconductor package sealing resin material used to seal an optical semiconductor chip in a semiconductor package, the optical semiconductor package sealing resin material comprising a thermosetting epoxy composition and a hydrophobic smectite clay mineral, wherein:
   the thermosetting epoxy composition comprises a total amount of a urethane resin and/or an acrylic resin ranging from 1 to 20 mass % based on a total amount of resin components in the thermosetting epoxy composition; and
   the sealing resin material has a thixotropy index value ranging from 4.4 to 5.5.

2. The optical semiconductor package sealing resin material according to claim 1, wherein the hydrophobic smectite clay mineral is hydrophobized by subjecting a hydrophilic smectite clay mineral to an intercalation reaction with an alkylammonium halide.

3. The optical semiconductor package sealing resin material according to claim 1, wherein the smectite clay mineral is bentonite, saponite, hectorite, vermiculite, stevensite, tainiolite, montmorillonite, or nontronite.

4. The optical semiconductor package sealing resin material according to claim 1, wherein the hydrophobic smectite clay mineral is contained in an amount of 1 to 10 mass %.

5. The optical semiconductor package sealing resin material according to claim 1, wherein the thermosetting epoxy composition contains an alicyclic epoxy compound and/or a hydrogenated aromatic epoxy compound, and an acid anhydride curing agent.

6. The optical semiconductor package sealing resin material according to claim 5, wherein a total amount of the alicyclic epoxy compound and the hydrogenated aromatic epoxy compound based on a total amount of resin components in the thermosetting epoxy composition is 50 to 95 mass %.

7. The optical semiconductor package sealing resin material according to claim 5, wherein a ratio of an epoxy equivalent of the epoxy compound contained in the thermosetting epoxy composition to an acid anhydride equivalent of the acid anhydride curing agent is 0.85 to 1.15.

8. An optical semiconductor device comprising an optical semiconductor chip and the optical semiconductor package sealing resin material according to claim 1, wherein the optical semiconductor chip is sealed with the optical semiconductor package sealing resin material to thereby form a semiconductor package.

9. A method of manufacturing an optical semiconductor device, comprising sealing an optical semiconductor chip in a semiconductor package with an optical semiconductor package sealing resin material, wherein:
  the optical semiconductor package sealing resin material comprises a thermosetting epoxy composition and a hydrophobic smectite clay mineral;
  the thermosetting epoxy composition comprises a total amount of a urethane resin and/or an acrylic resin ranging from 1 to 20 mass % based on a total amount of resin components in the thermosetting epoxy composition; and
  the sealing resin material has a thixotropy index value ranging from 4.4 to 5.5.

10. The optical semiconductor package sealing resin material according to claim 6, wherein the total amount of the alicyclic epoxy compound and the hydrogenated aromatic epoxy compound ranges from 75 to 95 mass % and the hydrophobic smectite clay mineral is contained in an amount of 1 to 10 mass %.

* * * * *

UNITED STATES PATENT AND TRADEMARK OFFICE
CERTIFICATE OF CORRECTION

PATENT NO. : 8,415,706 B2
APPLICATION NO. : 12/734927
DATED : April 9, 2013
INVENTOR(S) : Hideaki Umakoshi Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 230 days.

Signed and Sealed this
Thirteenth Day of August, 2013

Teresa Stanek Rea
*Acting Director of the United States Patent and Trademark Office*